United States Patent [19]

Muthupillai et al.

[11] Patent Number: 5,899,858
[45] Date of Patent: May 4, 1999

[54] MR IMAGING WITH ENHANCED SENSITIVITY OF SPECIFIC SPIN MOTION

[75] Inventors: Raja Muthupillai, Decatur, Ga.; Richard L. Ehman, Rochester, Minn.

[73] Assignee: Mayo Foundation for Medical Education and Research, Rochester, Minn.

[21] Appl. No.: 09/058,624

[22] Filed: Apr. 9, 1998

Related U.S. Application Data

[60] Provisional application No. 60/043,420, Apr. 10, 1997.

[51] Int. Cl.$^6$ ..................................................... A61B 5/055
[52] U.S. Cl. ........................... 600/410; 324/307; 324/309
[58] Field of Search ............................. 600/410; 324/307, 324/309, 312, 314, 318, 322

[56] References Cited

U.S. PATENT DOCUMENTS 5,592,085  1/1997  Ehman ..................................... 324/309
5,825,186  10/1998  Ehman et al. ........................... 324/309

*Primary Examiner*—Marvin M. Lateef
*Assistant Examiner*—Eleni Mantis Mercader
*Attorney, Agent, or Firm*—Quarles & Brady, LLP

[57] ABSTRACT

The alternating magnetic field gradient used to sensitize an NMR signal to spin motion is modulated in amplitude with a window function to tailor it to the particular NMR measurement. In an MR elastography measurement, the gradient is a sinusoidal waveform having a frequency the same as an applied oscillatory stress, and the window function desensitizes the measurement to spin motions at other frequencies.

10 Claims, 4 Drawing Sheets

MR IMAGING WITH ENHANCED SENSITIVITY OF SPECIFIC SPIN MOTION

This Application claims benefit of provisional Application Ser. No. 60/043,420 filed Apr. 10, 1997.

BACKGROUND OF THE INVENTION

The field of the invention is nuclear magnetic resonance imaging methods and systems. More particularly, the invention relates to the enhancement of MR image contrast.

The physician has many diagnostic tools at his or her disposal which enable detection and localization of diseased tissues. These include x-ray systems that measure and produce images indicative of the x-ray attenuation of the tissues and ultrasound systems that detect and produce images indicative of tissue echogenicity and the boundaries between structures of differing acoustic properties. Nuclear medicine produces images indicative of those tissues which absorb tracers injected into the patient, as do PET scanners and SPECT scanners. And finally, magnetic resonance imaging ("MRI") systems produce images indicative of the magnetic properties of tissues. It is fortuitous that many diseased tissues are detected by the physical properties measured by these imaging modalities, but it should not be surprising that many diseases go undetected.

Historically, one of the physician's most valuable diagnostic tools is palpation. By palpating the patient a physician can feel differences in the compliance of tissues and detect the presence of tumors and other tissue abnormalities. Unfortunately, this valuable diagnostic tool is limited to those tissues and organs which the physician can feel, and many diseased internal organs go undiagnosed unless the disease happens to be detectable by one of the above imaging modalities. Tumors (e.g. of the liver) that are undetected by existing imaging modalities and cannot be reached for palpation through the patient's skin and musculature, are often detected by surgeons by direct palpation of the exposed organs at the time of surgery. Palpation is the most common means of detecting tumors of the prostate gland and the breast, but unfortunately, deeper portions of these structures are not accessible for such evaluation. An imaging system that extends the physician's ability to detect differences in tissue compliance throughout a patient's body would extend this valuable diagnostic tool.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant γ of the nucleus). Nuclei which exhibit this phenomena are referred to herein as "spins", and materials which contain such nuclei are referred to herein as "gyromagnetic".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, Mz, may be rotated, or "tipped", into the x-y plane to produce a net transverse magnetic moment $M_t$, which is rotating, or spinning, in the xy plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which are superimposed on the polarizing field $B_0$, but which have a gradient along the respective x, y and z axes. By controlling the strength of these gradients during each NMR cycle, the spatial distribution of spin excitation can be controlled and the location of the resulting NMR signals can be identified.

It is well known that NMR can be used to detect and image the movement of spins. As disclosed in U.S. Pat. No. Re. 32,701 entitled *"NMR Scanner With Motion Zeugmatography"*, acquired NMR signals can be sensitized to detect moving spins by applying a bipolar magnetic field gradient at the proper moment in each NMR measurement sequence. The phase of the resulting NMR signal measures the velocity of spins along the direction of the motion sensitizing magnetic field gradient. With more complex motion sensitizing magnetic field gradients, higher orders of motion, such as acceleration and jerk can also be measured with this method.

As described in U.S. Pat. No. 5,592,085, it has been found that MRI imaging can be enhanced when an oscillating stress is applied to the object being imaged in a method called MR elastography. The method requires that the oscillating stress produce shear waves that propagate through the organ, or tissues to be imaged. These shear waves alter the phase of the NMR signals, and from this the mechanical properties of the subject can be determined. In many applications the production of shear waves in the tissues is merely a matter of physically vibrating the surface of the subject with an electromechanical device such as that disclosed in above-cited U.S. Pat. No. 5,592,085 which is incorporated herein by reference. For example, shear waves may be produced in the breast and prostate by direct contact with the oscillatory device. Also, with organs like the liver, the oscillatory force can be directly applied by means of an applicator that is inserted into the organ.

MR elastography employs an oscillatory magnetic field gradient which is synchronized with the applied oscillatory stress and which motion sensitizes the acquired NMR signals to the resulting spin motion. Unfortunately, an oscillatory magnetic field gradient not only sensitizes to the desired shear wave motion of the spins, but also to other motion components. For example, the phase of the acquired NMR signals is also sensitized to spin motion caused by patient respiration, cardiac motion, and blood flow. There is a need for a method which sensitizes NMR signals to specific frequencies and components of spin motion.

SUMMARY OF THE INVENTION

The present invention is a method for acquiring MR image data in which the phase of the acquired NMR signal is made sensitive to a specific spin motion component. More particularly, the method includes the application of an RF excitation field to the spins in the presence of a polarizing magnetic field to produce transverse magnetization therein, applying an alternating magnetic field gradient to the spins to sensitize the transverse magnetization for a spin motion component, and acquiring an NMR signal; wherein the alternating magnetic field gradient has a frequency corresponding to the frequency of the desired spin motion component and the amplitude of the alternating magnetic field gradient is modulated by a window function which tailors the spectral response to the desired spin motion component.

A general object of the invention is to sensitize acquired NMR signals to a particular spin motion component. By forming an alternating magnetic field gradient with one or more frequency components, the phase of the NMR signals can be sensitized to spin motions that oscillate at the same frequency(s). By amplitude modulating the alternating field gradient with a window function, the phase of the NMR signals can be desensitized to other spin motion components. The spectral response of the acquired NMR signals can thus be tailored to the particular requirements of the measurement.

A more specific object of the invention is to improve the sensitivity and signal-to-noise ratio of phase images produced for magnetic resonance elastography. The alternating magnetic field gradient is tailored to provide phase sensitivity for the particular frequency used to produce shear waves in the subject. The NMR signals are desensitized to other motions in the subject by amplitude modulating the alternating magnetic field gradient with a window function that effectively filters out other spin motion components.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

GENERAL DESCRIPTION OF THE INVENTION

Figure 1:
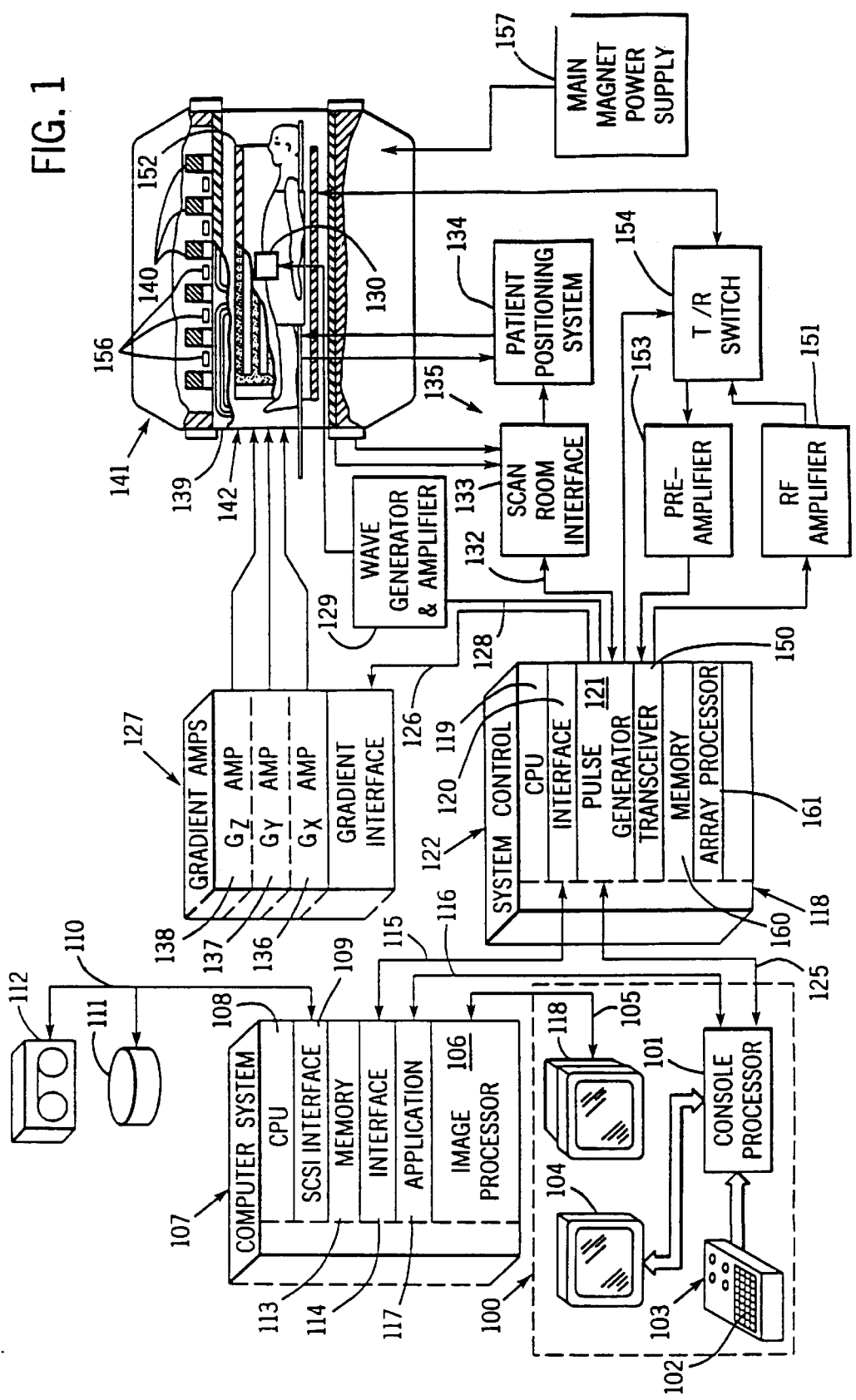
FIG. 1 is a block diagram of an NMR system which employs the present invention.

As early as 1960, it was recognized in the MR literature that motion of transverse magnetization in the presence of a magnetic field gradient alters the phase of the transverse spin. This effect was exploited in the above-cited Pat. No. Re. 32,701 to encode spin motion, specifically blood flow. This was accomplished by extending the Larmor relationship to take spin motion into account. The time varying position vector was approximated by a polynomial function using the Taylor's series expansion. This theoretical analysis provides insight into the process of encoding various components of spin motion.

The phase of the spins moving in the presence of a magnetic field gradient can be expressed as, $$\phi(t) = \omega(t)dt = \gamma B(t)dt. \quad (1)$$

If a magnetic field gradient $G_r(t)$ is superimposed on the main magnetic field $B_0$ along direction r, then the phase of the NMR signals produced by spins moving along the direction r is given by, $$\varphi(t) = \gamma \int [B_0 + G_r(t')] \cdot r(t')dt', \quad (2)$$
$$= \gamma \int B_0 \cdot r(t')dt' + \gamma \int G_r(t') \cdot r(t')dt'.$$

The first term in the above equation is a constant, since $B_0$ is not time-varying and is spatially invariant and therefore, does not reflect information about spin motion. It is the second term that is of interest in motion detection. Pat. No. Re. 32,701 taught that the position vector r(t) could be decomposed as a Taylor's series, $$r(t) = r_0 + v_0 t + \frac{a_0 t^2}{2} + \ldots \quad (3)$$

Then the above equation (2) can be written as, $$\varphi(t) = r_0 \int \gamma G_r(t')dt' + r_0 \int \gamma G_r(t')dt' + \quad (4)$$
$$\frac{a_0}{2} \int \gamma G_r(t')t'^2 dt' + \ldots,$$
$$= r_0 M_0 + v_0 M_1 + a_0 M_2 + \ldots,$$

where $r_0$, $v_0$ and $a_0$, are the zeroth, first and second derivatives of the position vector r at time t=0; and $M_0$, $M_1$, and $M_2$ are the zeroth, first and second temporal moments of the gradient waveform. Thus, with an appropriate gradient waveform, it is possible to sensitize the phase of NMR signals to individual components of spin motion. In other words, the zeroth moment, $M_0$, of a gradient waveform encodes the spatial position of the spins, while a gradient waveform with a finite first moment, $M_1$, encodes the velocity component of spin motion. The phase of the received NMR signal can thus be made to yield information about spin motion by applying a suitable magnetic field gradient to the spins during the NMR pulse sequence. This concept is widely used in NMR imaging to accomplish such disparate goals as measuring specific components of spin motion and measuring blood flow. The same strategy can be used to suppress artifacts caused by spin motion by selectively nulling the temporal moments of the gradient waveforms used in the NMR pulse sequence. This method is referred to as gradient moment nulling and is described, for example, in U.S. Pat. No. 4,731,583.

While the formalism of describing motion by Taylor series expansion is useful, such description is limited due to the implicit assumption that the temporal displacement function can be approximated by polynomial functions. Under a number of conditions, such assumptions do not hold. For example, while a Taylor series expansion of the position vector is useful in describing flow in simple vessels, it is often inadequate in describing turbulent flow due to vascular stenoses or sharp bends.

We propose a new method for analyzing the spin motion in the Fourier domain. This involves two steps: a) decomposing spin motion using a Fourier series and b) considering the gradient waveforms as "filters" that selectively measure harmonic components of spin motion. Under this assumption, one considers the gradient waveform "spectrum" to analyze its ability to sensitize for spin motion. Therefore, by tailoring the gradient waveform spectrum one can alter the sensitivity of the NMR measurement pulse sequence to different components of spin motion. This approach can be very powerful for a number of NMR applications, such as MR elastography.

When practicing MR elastography, for example, one would like to use sinusoidal magnetic field gradients that are of infinite length, to sensitize for a single frequency of spin motion (i.e., the frequency of the oscillating stress applied to the subject.) This is because the Fourier transformation of the infinitely long sinusoid is a delta function, which sensitizes to only a single frequency. However, tissues have a finite $T_2$ relaxation time and, therefore, the duration of the NMR measurement pulse sequence, and hence the duration over which the sinusoidal gradient can be applied is limited. This causes temporal apodization of the motion sensitizing gradient waveform. This apodization causes the frequency spectrum to which the gradient waveform sensitizes for spin motion to occur at many frequencies. This is because the multiplication of the sinusoidal gradient waveform with the apodizing function (typically rectangular gradients) in the time domain is a convolution of the Fourier spectra of the sinusoidal gradient waveform and the apodizing function. The Fourier transformation of a rectangular apodizing function is an infinitely long sinc function, resulting in a broadband sensitivity to spin motion and side lobes.

The Fourier domain representation of the motion sensitizing gradient waveform provides a solution to this problem of sensitivity to motion occurring at other frequencies. More specifically, by multiplying the sinusoidal gradient waveform with an appropriate window function which has minimal sidelobes, one can tailor the spectral response of the resulting motion sensitizing gradient waveform. Therefore, a teaching of the present invention is that the choice of motion encoding gradient waveform can be constrained by the following considerations:

a) the motion encoding gradient waveform should be maximally sensitive to cyclic motion occurring at the desired frequency;

b) the gradient waveform must be minimally sensitive to motion occurring at other frequencies; and c) the gradient waveform should not violate the basic spatial encoding requirements of the imaging pulse sequence.

The first requirement, a) is met if the frequency of the sinusoidal oscillations of the motion-encoding gradient is made the same as the frequency of the cyclic spin motion to be detected. If the integral of the gradient waveform is made zero, spatial encoding is not affected by the waveform and requirement c) is met. The response of the gradient waveform to motion occurring at other frequencies is minimized by modulating the amplitude of the gradient waveform with an appropriate windowing function. This windowing function has minimal side lobes and the frequency spectrum of the resulting modulated gradient waveform is band-limited and spectrally selective. For example, by multiplying the sinusoidal gradient waveform with a windowing function such as the Blackman window, one can increase the stop band attenuation to as much as 58 dB, and minimize side lobe sensitivity. Reference is made to "Digital Signal Processing" by A. V. Oppenheim and R. W. Schafer, published in 1975 by Prentice Hall for a detailed description of exemplary window functions that may be used with the present invention.

The shape of the gradient waveform can also be tailored to sensitize the acquired NMR signals to a band of frequencies. This is accomplished by producing a composite gradient waveform composed of the sum of the sinusoidal gradient waveforms at the specific frequency components in the desired band of frequencies. In other words, the spectral content of the motion encoding gradient waveform determines the frequencies to which it sensitizes the acquired NMR signals. The duration of the motion encoding gradient waveform must be chosen such that the separate frequency components therein have an integral number of their corresponding periods. This ensures that the net gradient area of each separate frequency component is zero and that the spatial encoding process is not, therefore, violated. By multiplying this composite waveform, with an appropriate window, such as the Blackman window, one obtains a motion encoding gradient waveform with the desired spectral sensitivity. Thus, the amplitude modulated composite gradient waveform serves as a band-pass filter to detect Fourier components of spin motion. One can also use more general forms of the windowing functions such as the Kaiser-Bessel window to obtain an arbitrary degree of stop-band attenuation.

The present invention may also be employed to desensitize NMR signals to specific types of spin motion. As described above, multiplying the cyclic gradient waveforms with windowing functions offers the possibility of detecting specific cyclic spin motion. However, the spins might also be undergoing simple bulk rigid body motion in addition to the cyclic spin motion. In this case, the bulk spin motion can be of some concern, because it can introduce spurious phase effects in the NMR signals. Multiplying with the windowing functions discussed above has the added advantage of making the gradient waveform "even" (if the cyclic gradient is cosinusoidal). For an even gradient waveform, all of its odd temporal gradient moments vanish. For example, such a gradient waveform will be immune to first order motion effects, such as velocity. In other words, such a gradient waveform is inherently flow-compensated. In addition, such a gradient waveform is also insensitive to other odd orders of motion, as well. This can result in significant immunity to bulk motion effects. Similarly, if the amplitude of a sinusoidal gradient waveform is modulated by the windowing function, then the resulting motion encoding gradient waveform will be insensitive to all "even" orders of motion such as acceleration, etc. This can be useful in cases where convective acceleration effects are the primary undesired source of motion related artifacts.

DESCRIPTION OF THE PREFERRED EMBODIMENT

Referring first to FIG. 1, there is shown the major components of a preferred NMR system which incorporates the present invention and which is sold by the General Electric Company under the trademark "SIGNA". The operation of the system is controlled from an operator console 100 which includes a console processor 101 that scans a keyboard 102 and receives inputs from a human operator through a control panel 103 and a plasma display/touch screen 104. The console processor 101 communicates through a communications link 116 with an applications interface module 117 in a separate computer system 107. Through the keyboard 102 and controls 103, an operator controls the production and display of images by an image processor 106 in the computer system 107, which connects directly to a video display 118 on the console 100 through a video cable 105.

The computer system 107 includes a number of modules which communicate with each other through a backplane. In addition to the application interface 117 and the image processor 106, these include a CPU module 108 that controls the backplane, and an SCSI interface module 109 that connects the computer system 107 through a bus 110 to a set of peripheral devices, including disk storage 111 and tape drive 112. The computer system 107 also includes a memory module 113, known in the art as a frame buffer for storing image data arrays, and a serial interface module 114 that links the computer system 107 through a high speed serial link 115 to a system interface module 120 located in a separate system control cabinet 122.

The system control 122 includes a series of modules which are connected together by a common backplane 118. The backplane 118 is comprised of a number of bus structures, including a bus structure which is controlled by a CPU module 119. The serial interface module 120 connects this backplane 118 to the high speed serial link 115, and pulse generator module 121 connects the backplane 118 to the operator console 100 through a serial link 125. It is through this link 125 that the system control 122 receives commands from the operator which indicate the scan sequence that is to be performed.

The pulse generator module 121 operates the system components to carry out the desired scan sequence. It produces data which indicates the timing, strength and shape of the RF pulses which are to be produced, and the timing of and length of the data acquisition window. The pulse generator module 121 also connects through serial link 126 to a set of gradient amplifiers 127, and it conveys data thereto which indicates the timing and shape of the gradient pulses that are to be produced during the scan.

In the preferred embodiment of the invention the pulse generator module 121 also produces sync pulses through a serial link 128 to a wave generator and amplifier 129. The wave generator produces a sinusoidal voltage which is synchronized to the frequency and phase of the received sync pulses and this waveform is output though a 50 watt, dc coupled audio amplifier. A frequency in the range of 20 Hz to 1000 Hz is produced depending on the particular object being imaged, and it is applied to a transducer 130. The transducer 130 produces a force, or pressure, which oscillates in phase with the sync pulses produced by the pulse generator module 121 and creates an oscillating stress in the gyromagnetic media (i.e. tissues) to which it is applied.

And finally, the pulse generator module 121 connects through a serial link 132 to scan room interface circuit 133 which receives signals at inputs 135 from various sensors associated with the position and condition of the patient and the magnet system. It is also through the scan room interface circuit 133 that a patient positioning system 134 receives commands which move the patient cradle and transport the patient to the desired position for the scan.

The gradient waveforms produced by the pulse generator module 121 are applied to a gradient amplifier system 127 comprised of $G_x$, $G_y$ and $G_z$ amplifiers 136, 137 and 138, respectively. Each amplifier 136, 137 and 138 is utilized to excite a corresponding gradient coil in an assembly generally designated 139. The gradient coil assembly 139 forms part of a magnet assembly 141 which includes a polarizing magnet 140 that produces either a 0.5 or a 1.5 Tesla polarizing field that extends horizontally through a bore 142. The gradient coils 139 encircle the bore 142, and when energized, they generate magnetic fields in the same direction as the main polarizing magnetic field, but with gradients $G_x$, $G_y$ and $G_z$ directed in the orthogonal x-, y- and z-axis directions of a Cartesian coordinate system. That is, if the magnetic field generated by the main magnet 140 is directed in the z direction and is termed $B_0$, and the total magnetic field in the z direction is referred to as $B_z$, then $G_x=\partial B_z/\partial x$, $G_y=\partial B_z/\partial y$ and $G_z=\partial B_z/\partial z$, and the magnetic field at any point (x,y,z) in the bore of the magnet assembly 141 is given by $B(x,y,z)=B_0+G_x x+G_y y+G_z z$. The gradient magnetic fields are utilized to encode spatial information into the NMR signals emanating from the patient being scanned, and as will be described in detail below, they are employed to measure the microscopic movement of spins caused by the pressure produced by the transducer 130.

Located within the bore 142 is a circular cylindrical whole-body RF coil 152. This coil 152 produces a circularly polarized RF field in response to RF pulses provided by a transceiver module 150 in the system control cabinet 122. These pulses are amplified by an RF amplifier 151 and coupled to the RF coil 152 by a transmit/receive switch 154 which forms an integral part of the RF coil assembly. Waveforms and control signals are provided by the pulse generator module 121 and utilized by the transceiver module 150 for RF carrier modulation and mode control. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

In addition to supporting the polarizing magnet 140 and the gradient coils 139 and RF coil 152, the main magnet assembly 141 also supports a set of shim coils 156 associated with the main magnet 140 and used to correct inhomogeneities in the polarizing magnet field. The main power supply 157 is utilized to bring the polarizing field produced by the superconductive main magnet 140 to the proper operating strength and is then removed.

The NMR signals picked up by the RF coil 152 are digitized by the transceiver module 150 and transferred to a memory module 160 which is also part of the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 as will be described in more detail below and conveyed to the operator console 100 and presented on the video display 118.

Figure 2:
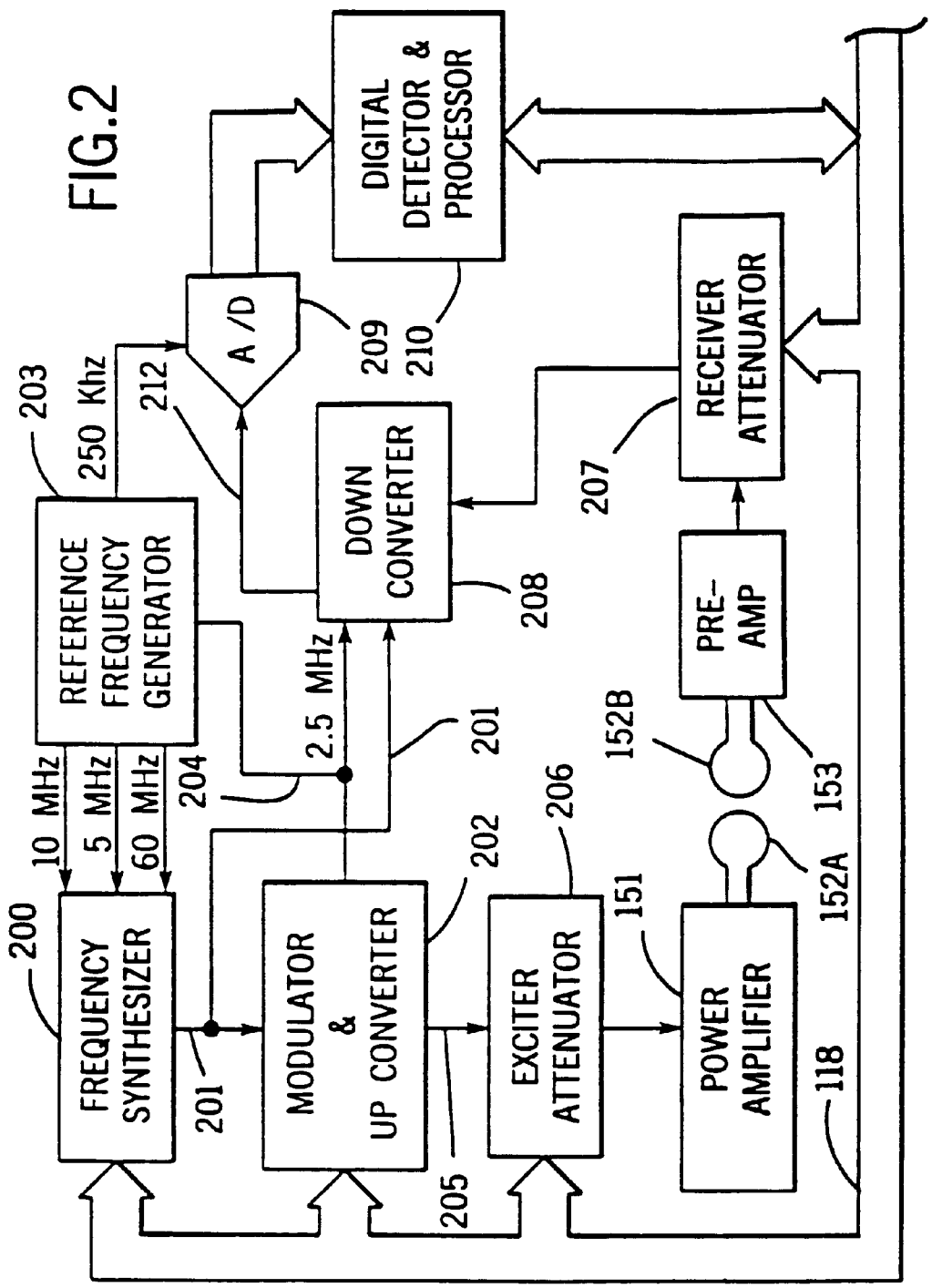
FIG. 2 is an electrical block diagram of the transceiver which forms part of the NMR system of FIG. 1.

Referring particularly to FIGS. 1 and 2, the transceiver 150 includes components which produce the RF excitation field $B_1$ through power amplifier 151 at a coil 152A and components which receive the resulting NMR signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals through the backplane 118 from the CPU module 119 and pulse generator module 121. These digital signals indicate the frequency and phase of the RF carrier signal which is produced at an output 201. The commanded RF carrier is applied to a modulator and up converter 202 where its amplitude is modulated in response to a signal R(t) also received through the backplane 118 from the pulse generator module 121. The signal R(t) defines the envelope, and therefore the bandwidth, of the RF excitation pulse to be produced. It is produced in the module 121 by sequentially reading out a series of stored digital values that represent the desired envelope. These stored digital values may, in turn, be changed from the operator console 100 to enable any desired RF pulse envelope to be produced. The modulator and up converter 202 produces an RF pulse at the desired Larmor frequency at an output 205.

The magnitude of the RF excitation pulse output through line 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIG. 1 and 2 the NMR signal produced by the subject is picked up by the receiver coil 152B and applied through the preamplifier 153 to the input of a receiver attenuator 207. The receiver attenuator 207 further amplifies the NMR signal and this is attenuated by an amount determined by a digital attenuation signal received from the backplane 118. The receive attenuator 207 is also turned on and off by a signal from the pulse generator module 121 such that it is not overloaded during RF excitation.

The received NMR signal is at or around the Larmor frequency, which in the preferred embodiment is around 63.86 MHz for 1.5 Tesla and 21.28 MHz for 0.5 Tesla. This high frequency signal is down converted in a two step process by a down converter 208 which first mixes the NMR signal with the carrier signal on line 201 and then mixes the resulting difference signal with the 2.5 MHz reference signal on line 204. The resulting down converted NMR signal on line 212 has a maximum bandwidth of 125 kHz and it is centered at a frequency of 187.5 kHz. The down converted NMR signal is applied to the input of an analog-to-digital (A/D) converter 209 which samples and digitizes the analog signal at a rate of 250 kHz. The output of the A/D converter 209 is applied to a digital detector and signal processor 210 which produce 16-bit in-phase (I) values and 16-bit quadrature (Q) values corresponding to the received digital signal. The resulting stream of digitized I and Q values of the received NMR signal is output through backplane 118 to the memory module 160 where they are employed to reconstruct an image.

To preserve the phase information contained in the received NMR signal, both the modulator and up converter 202 in the exciter section and the down converter 208 in the receiver section are operated with common signals. More particularly, the carrier signal at the output 201 of the frequency synthesizer 200 and the 2.5 MHz reference signal at the output 204 of the reference frequency generator 203 are employed in both frequency conversion processes. Phase consistency is thus maintained and phase changes in the detected NMR signal accurately indicate phase changes produced by the excited spins. The 2.5 MHz reference signal as well as 5, 10 and 60 MHz reference signals are produced by the reference frequency generator 203 from a common 20 MHz master clock signal. The latter three reference signals are employed by the frequency synthesizer 200 to produce the carrier signal on output 201. For a more detailed description of the receiver, reference is made to U.S. Pat. No. 4,992,736 which is incorporated herein by reference.

Figure 3:
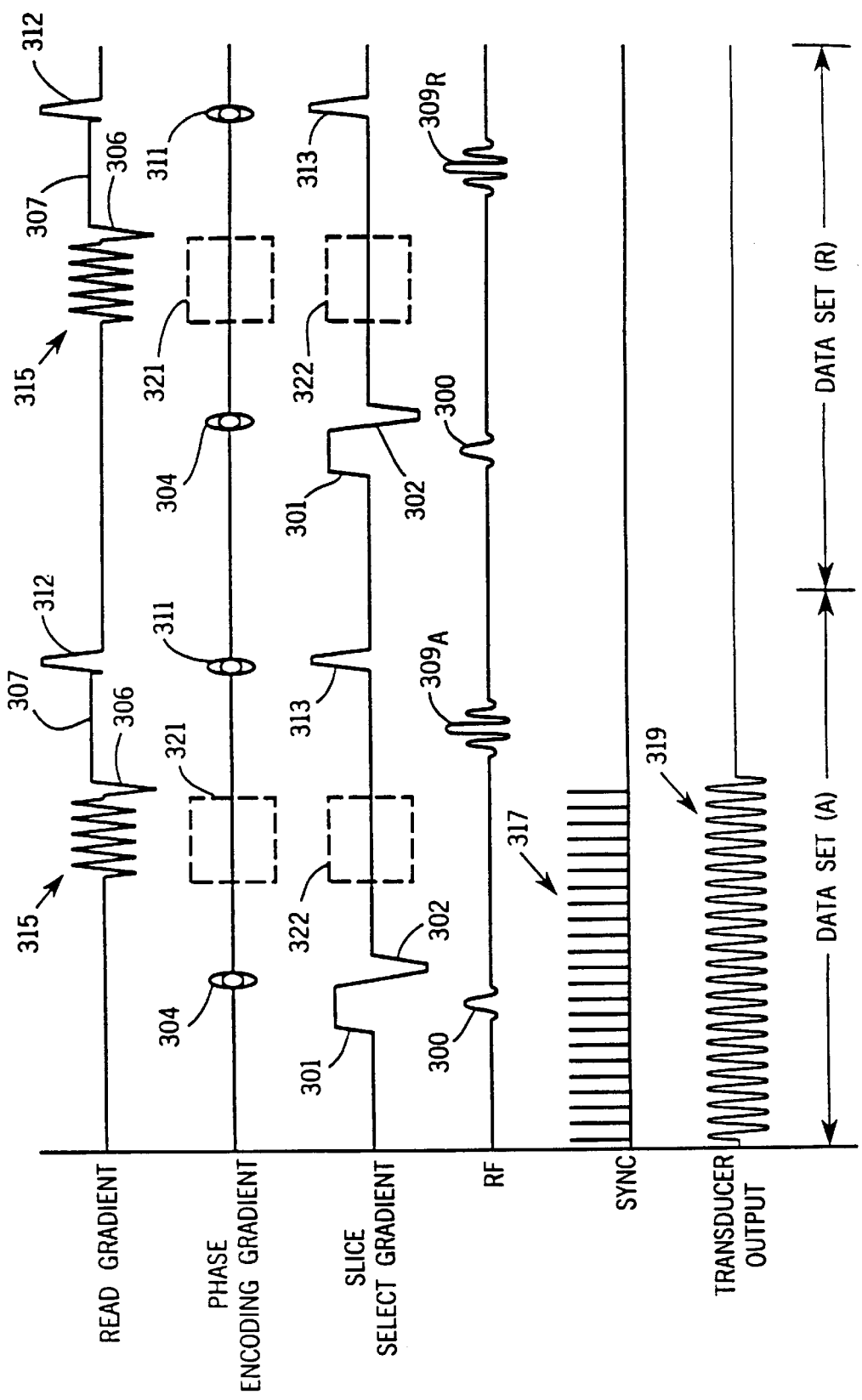
FIG. 3 is a graphic representation of a pulse sequence performed by the NMR system of FIG. 1 to practice the preferred embodiment of the invention.

Referring particularly to FIG. 3, a preferred embodiment of a pulse sequence which may be used to acquire MR elastography data is shown. Actually, two pulse sequences are shown, with the first being used to acquire NMR data for a synchronous spin motion image (A), and the second being used to acquire NMR data for a reference image (R). These two pulse sequences are alternated throughout the scan such that the corresponding views (i.e. phase encodings) in the data sets (A) and (R) are acquired at substantially the same moment in time.

The pulse sequences are fundamentally a 2DFT pulse sequence using a gradient recalled echo. Transverse magnetization is produced by a selective 90° rf excitation pulse 300 which is produced in the presence of a slice select gradient ($G_z$) pulse 301 and followed by a rephasing gradient pulse 302. A phase encoding gradient ($G_y$) pulse 304 is then applied at an amplitude and polarity determined by the view number of the acquisition. A read gradient ($G_x$) is applied as a negative dephasing lobe 306, followed by a positive readout gradient pulse 307. An NMR echo signal 309 is acquired 40 msecs. after the rf excitation pulse 300 during the readout pulse 307 to frequency encode the 256 digitized samples. The pulse sequence is concluded with spoiler gradient pulses 312 and 313 along read and slice select axes, and a rephasing gradient pulse 311 is applied along the phase encoding axis ($G_y$). As is well known in the art, this rephasing pulse 311 has the same size and shape, but opposite polarity of the phase encoding pulse 304. The pair of pulse sequences are repeated 128 times with the phase encoding pulse 304 stepped through its successive values to acquire a 128 by 256 array of complex NMR signal samples that comprise the data set (A) and a 128 by 256 array of complex NMR signal samples that comprise the reference data set (R).

To practice MR elastography an alternating magnetic field gradient is applied after the transverse magnetization is produced and before the NMR signal is acquired. In the preferred embodiment illustrated in FIG. 3, the read gradient ($G_x$) is used for this function and is shaped according to the present invention to provide the motion encoding gradient waveform 315. The alternating gradient 315 has a frequency of 125 Hz and a duration of 24 msecs. At the same time, the pulse generator module 121 produces sync pulses as shown at 317, which are also at a frequency of 125 Hz and have a specific phase relationship with the alternating gradient pulses 315. As explained above, these sync pulses 317 activate the transducer 130 to apply an oscillating stress 319 to the patient which has the same frequency and phase relationship. To insure that the resulting waves have time to propagate throughout the field of view, the sync pulses 317 may be turned on well before the pulse sequence begins, as shown in FIG. 3.

The phase of the NMR signal $309_A$ acquired during the first pulse sequence (A) is indicative of the movement of the spins. If the spins are stationary, the phase of the NMR signal is not altered by the alternating gradient pulses 315, whereas spins moving along the read gradient axis (x) will accumulate a phase proportional to their velocity. Spins which move in synchronism and in phase with the alternating magnetic field gradient 215 will accumulate maximum phase of one polarity, and those which move in synchronism, but 180° out of phase with the alternating magnetic field gradient 215 will accumulate maximum phase of the opposite polarity. The phase of the acquired NMR signal $309_A$ is thus affected by system phase errors and random movement of spins along the x-axis, as well as the "synchronous" movement of spins along the x-axis.

The reference pulse sequence is designed to measure the signal phase produced by sources other than synchronized spin movement. This is accomplished by repeating the identical pulse sequence, but without applying the oscillating stress 319. As a result, the phase of the acquired NMR signal $309_R$ will be affected by "static" system phase errors caused by field inhomogeneities and the like as well as the phase due to random spin movement along the x-axis. However, there will not be a phase component due to synchronous spin movement and the reference phase $\phi_R$ can, therefore, be subtracted from the phase $\phi_A$ to yield the phase ($\phi$) due solely to synchronous spin motion.

The pulse sequence in FIG. 3 can be modified to measure synchronous spin movement along the other gradient axes (y and z). For example, the alternating magnetic field gradient pulses may be applied along the phase encoding axis (y) as indicated by dashed lines 321, or they may be applied along the slice select axis (z) as indicated by dashed lines 322. Indeed, they may be applied simultaneously to two or three of the gradient field directions to "read" synchronous spin movements along any desired direction.

MR elastography may be implemented using most types of MR imaging pulse sequences. Other gradient echo sequences can be readily modified to incorporate the motion encoding gradient waveform as illustrated in the preferred embodiment. In some cases, however, the characteristics of a gradient echo sequence may not be ideal for a particular application of the technique. For example, some tissues (such as those with many interfaces between materials with dissimilar magnetic susceptibilities) may have a relatively short T2* relaxation time and therefore may not provide enough signal to obtain a noise-free image at the required echo delay time. In this setting, a spin echo implementation of the invention may be ideal, because for a given echo delay time TE, this pulse sequence is much less sensitive to susceptibility effects than a gradient echo sequence. When a spin echo pulse sequence is used, the alternating magnetic field gradient can be applied either before and/or after the 180° rf refocusing pulse. However, if the alternating gradient is applied both before and after the rf inversion pulse, the phase of the alternating magnetic field gradient must be inverted 180° after the rf inversion pulse in order to properly accumulate phase.

In other applications, reduced acquisition time may be desirable. Fast spin echo and RARE sequences are rapid MRI sequences that acquire multiple views per TR cycle by applying different phase encoding gradients to each echo in a spin echo train. If 16 echoes, for instance, are acquired in each repetition of the sequence, then the total acquisition time for a complete image will be reduced by a factor of 16. One approach for modifying a fast spin echo sequence to implement MR elastography is to insert the motion encoding gradient waveform between the initial 90° RF pulse and the first 180° RF refocussing pulse, followed by a similar but inverted set of gradient pulses. The first echo in the train might be at a TE of 40–60 msec, but the spacing between subsequent echoes could be as short as 12–15 msec.

Echo-planar imaging ("EPI") is another approach for high speed MR acquisition. In one version of this technique, the spin echo created by standard 90° and 180° RF pulses is broken up into a series of 64–128 short gradient echoes by rapidly reversing the readout gradient. A different phase encoding is applied to each of the gradient echoes and therefore the acquired data from one shot of the sequence can, in principle, be used to reconstruct a complete image. One approach for modifying such an echo-planar sequence to practice MR elastography is to insert the motion encoding gradient waveform of the present invention between the initial 90°0 RF pulse and the 180° RF refocussing pulse, followed by a similar but inverted set of alternating gradient pulses. Such a sequence permits phase images to be obtained in only a few seconds or less.

Phase sensitivity to synchronous motion can be increased by applying both the alternating gradient pulses 315 and the sync pulses 317 during the reference pulse sequence. However, when this is done the phase of the alternating magnetic field gradient 315 must be inverted 180° relative to the sync pulses 317 so that the sign of the accumulated phase is reversed. Consequently, when the phase difference image is produced the phase accumulations due to synchronous spin motion add together, while phase accumulations due to other sources subtract and are thereby nulled.

Figure 4:
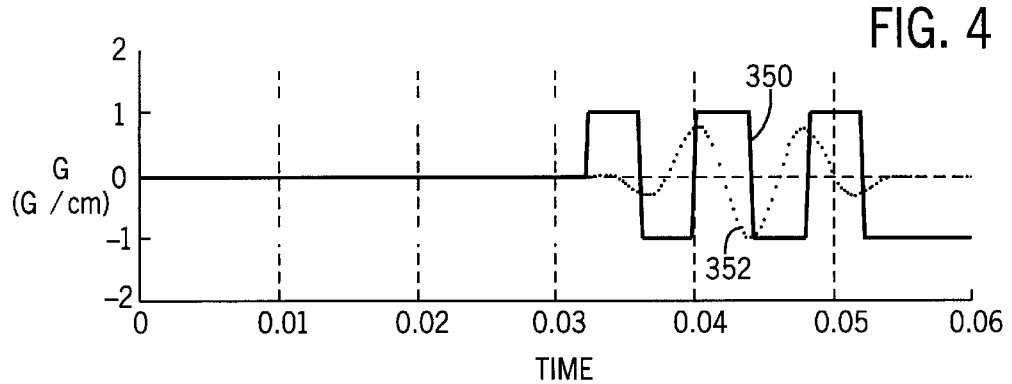
FIG. 4 is a graphic illustration of a conventional alternating magnetic field gradient waveform used in MRE and the improved magnetic field gradient waveform according to the present invention.
Figure 5:
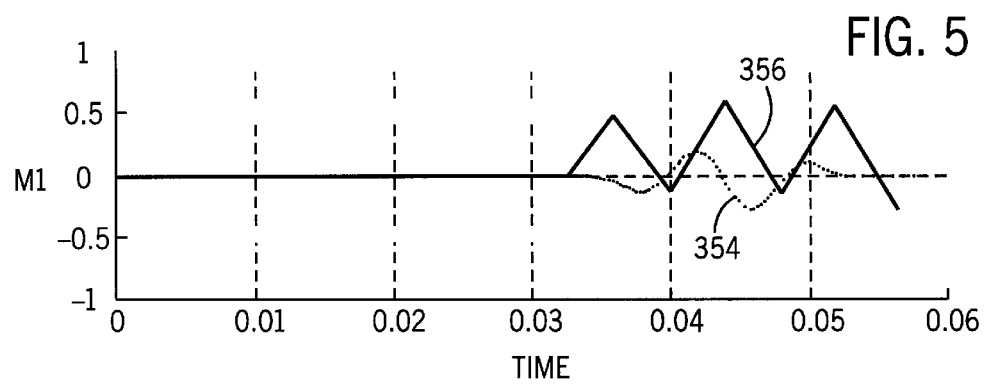
FIG. 5 is a graphic representation of the first moment of the gradient waveforms in FIG. 4.

The present invention is employed in the MR elastography ("MRE") pulse sequence of FIG. 3 to specifically sensitize the NMR echo signals 309 to the spin motion without sensitizing to other spin motions. Referring particularly to FIG. 4, rather than using a rectangular gradient waveform 350 which alternates in polarity at the desired frequency, an amplitude modulated cosine waveform 352 is used. This cosinusoidal gradient waveform 352 has a fundamental frequency that is the same as that of the transducer output 319 and its amplitude is modulated with a Hamming window function. The first moment $M_1$ of this cosinusoidal waveform is zero at the end of the waveform as shown at 354 in FIG. 5. This is contrasted with the net first moment $M_1$ produced by the rectangular gradient waveform 350 as indicated at 356.

Figure 6:
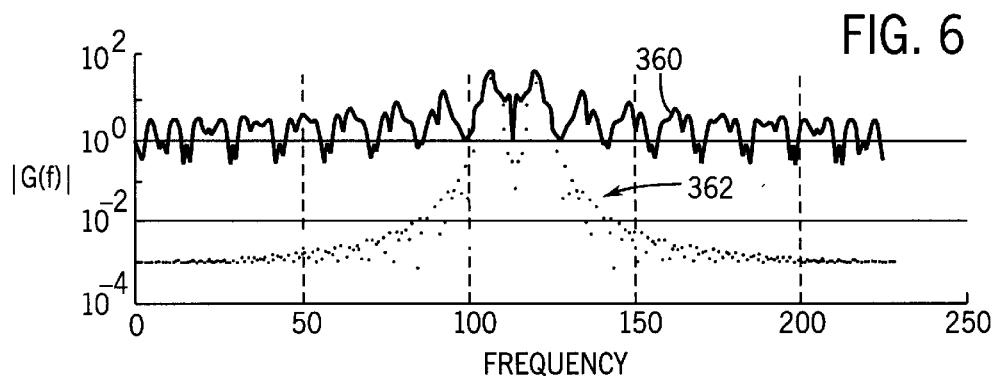
FIG. 6 is a graphic representation of the sensitivity to spin motions of different frequencies that result when the magnetic field gradient waveforms in FIG. 4 are used.

The spectral response of the resulting elastography pulse sequence is shown in FIG. 6. The motion sensitivity when a rectangular gradient waveform 350 is used is shown at 360. It is not selective, but instead, sensitizes substantially uniformly over a wide range of frequencies. In contrast, when the present invention is employed the elastography pulse sequence is selectively sensitive to the desired frequency as shown by curve 362. The phase of the resulting NMR echo signals is thus sensitive to the particular synchronous spin motion, and relatively insensitive to other spin motions.

The design of the alternating gradient waveform when applied to MRE involves the following considerations. The motion-sensitizing gradient waveform should be maximally sensitive to the desired cyclic motion and minimally sensitive to any other type of motion. Two sources of such undesired motion are: (i) non-periodic motion and (ii) subharmonics and higher harmonics of the cyclic motion of interest. Non-periodic spin motions are sensitized by non-zero temporal moments of the gradient waveform. Therefore, if the motion encoding gradient waveform is designed as even functions, then all the odd moments of the gradient waveform are zero and the sensitivity to such motion is reduced. This is accomplished by choosing functions that are even as discussed above.

Sensitivity to cyclic motion at undesired frequencies can be minimized by choosing a waveform which has a spectral response that has maximum sensitivity to the frequency of interest and a very high stop-band attenuation at other frequencies. As discussed above, this is accomplished by amplitude modulating a sinusoidal or cosinusoidal waveform with an appropriate window function. It should also be noted that modulation of the gradient waveform with such FIR filters, reduces the net sensitivity to cyclic motion, due to reduction in gradient area.

The present invention may also be used to produce gradient waveforms that facilitate other MRE measurement methods. Dispersion is a measure of change of shear wave propagation speed or attenuation with respect to frequency. This requires repetitive MRE measurements of shear wave speed and attenuation over a range of frequencies. The frequency domain representation of the Larmor equation can be used to reduce the number of measurements required by this method. Consider the mechanical excitation spectrum to be a function of a range of frequencies in which the dispersion measurement is required (instead of a single harmonic). By choosing a gradient waveform which is spectrally selective and includes this range of frequencies, it is possible to obtain snapshots of the propagating wavefront at different instances of time, within the material, by varying the phase offset between the applied composite motion encoding gradient waveform and the applied mechanical stress. Now, by obtaining a temporal Fourier transform of each pixel, along the time axis, one obtains the response of the subject, to a range of frequencies with respect to wave speed or attenuation, thus directly measuring velocity or attenuation dispersion.

The invention may also be used to compensate for the attenuation of the shear wave as it propagates through the subject. As a transient shear wave propagates through an object, it undergoes attenuation. A measure of attenuation can be obtained by using a series of cyclic motion sensitizing gradients to encode the spin displacements as the wave propagates through the object. As the wave propagates deeper into the object, the displacements can become too small to be detectable due to attenuation. Using a larger gradient strength to detect very small cyclic motion may also be undesirable, because this can cause aliasing near the surface of the object. However, it is possible to modulate the amplitude of the motion encoding gradient waveform by an exponentially increasing function (related to the attenuation coefficient of the medium) to compensate for reduced sensitivity due to less motion. This is analogous to the time-gain compensation techniques used in ultrasound systems.

While the present invention is particularly applicable to MRE, it also has application to other MR measurement methods. One of these is diffusion imaging in which a large bipolar gradient waveform is employed to sensitize to very slow spin motion. Under free diffusion, the mean square distance traveled by the molecules due to diffusion is related to the square root of the diffusion time. When the molecules cannot diffuse freely and are restricted by membranes and other boundaries, this relationship is no longer valid, and the mean-square distances travelled by the molecules due to diffusion tapers off with increasing diffusion time. In this case, to minimize the effects of restricted diffusion, one can use a number of alternating gradient pulses (instead of the conventional two (bipolar) gradient pulses). The amplitude of each pair of these diffusion encoding gradient pulses (or groups of pulses) can be modulated by a windowing function to minimize the sensitivity of these gradients to bulk motion. The penalty is decreased diffusion sensitivity due to lesser gradient area and added complexity of computing the "b" values of these shaped gradient pulses.

We claim:

1. A method for producing an NMR image of a subject which is affected by a specific spin motion, the steps comprising:

a) applying a polarizing magnetic field to the subject;

b) applying an RF excitation field to the subject to produce transverse magnetization of the spins therein;

c) applying an alternating magnetic field gradient to the subject to motion sensitize the transverse magnetization, the alternating magnetic field gradient having a frequency component corresponding to a frequency component of said specific spin motion, and the amplitude of the alternating magnetic field gradient being modulated in value to desensitize to other frequencies;

d) applying a phase encoding gradient to the subject;

e) acquiring an NMR signal indicative of the transverse magnetization;

f) repeating steps a) through e) with different values for the phase encoding gradient to acquire an image data set; and g) reconstructing an image using the acquired image data set.

2. The method as recited in claim 1 in which the specific spin motion component is a substantially sinusoidal spin motion at a frequency corresponding to the frequency of a stress applied to the subject.

3. The method as recited in claim 2 in which a window function selected to substantially limit the motion sensitization produced by the alternating magnetic field gradient to the frequency of the applied stress is employed to modulate the amplitude of the alternating magnetic field gradient.

4. The method as recited in claim 1 in which the alternating magnetic field gradient is substantially sinusoidal in shape.

5. The method as recited in claim 1 in which the integral of the alternating magnetic field gradient is substantially zero.

6. The method as recited in claim 1 in which the alternating magnetic field gradient has a plurality of frequency components selected to correspond with said specific spin motion.

7. The method as recited in claim 1 in which the alternating magnetic field gradient is substantially cosinusoidal in shape and the integral thereof is substantially zero.

8. The method as recited in claim 1 in which the alternating magnetic field gradient amplitude is modulated by a window function that is chosen to limit the frequency spectrum of the modulated alternating magnetic field gradient.

9. The method as recited in claim 8 in which the window function is a Blackman window function.

10. The method as recited in claim 8 in which the window function is a Hamming window function.

* * * * *